United States Patent
Sugano et al.

(10) Patent No.: US 9,086,445 B2
(45) Date of Patent: Jul. 21, 2015

(54) MAGNETIC DETECTION DEVICE

(71) Applicants: Ryoko Sugano, Tokyo (JP); Masahiko Ichimura, Tokyo (JP); Akihiko Kandori, Tokyo (JP)

(72) Inventors: Ryoko Sugano, Tokyo (JP); Masahiko Ichimura, Tokyo (JP); Akihiko Kandori, Tokyo (JP)

(73) Assignee: HITACHI, LTD., Tokyo (JP)

( * ) Notice: Subject to any disclaimer, the term of this patent is extended or adjusted under 35 U.S.C. 154(b) by 47 days.

(21) Appl. No.: 14/079,195

(22) Filed: Nov. 13, 2013

(65) Prior Publication Data

US 2014/0132257 A1    May 15, 2014

(30) Foreign Application Priority Data

Nov. 14, 2012   (JP) ................... 2012-250582

(51) Int. Cl.
  *B82Y 25/00*    (2011.01)
  *G01R 33/09*    (2006.01)

(52) U.S. Cl.
  CPC .................... *G01R 33/093* (2013.01)

(58) Field of Classification Search
  CPC ........................................ G01R 33/09
  USPC ........................................ 324/252
  See application file for complete search history.

(56) References Cited

U.S. PATENT DOCUMENTS

2004/0004261 A1    1/2004    Takahashi et al.
2010/0075599 A1*   3/2010    Xi et al. .............. 455/41.2

FOREIGN PATENT DOCUMENTS

JP          200439941 A     2/2004

* cited by examiner

*Primary Examiner* — Bot Ledynh
(74) *Attorney, Agent, or Firm* — Brundidge & Stanger, P.C.

(57) ABSTRACT

To increase an output from a magnetoresistive element without using a special magnetic material, provided is a magnetic detection device including a magnetoresistive element including a ferromagnetic reference layer having a fixed magnetization direction, to which a spin wave induction layer is connected, so that the spin wave induction layer injects, into the ferromagnetic reference layer, electrons having spins in a specific direction by a spin electromotive force internally generated.

8 Claims, 9 Drawing Sheets

MAGNETIC DETECTION DEVICE

CLAIM OF PRIORITY

The present application claims priority from Japanese patent application JP 2012-250582 filed on Nov. 14, 2012, the content of which is hereby incorporated by reference into this application.

TECHNICAL FIELD

The present invention relates to a magnetic detection device based on a magnetoresistance effect.

BACKGROUND ART

Magnetic sensors mounted at a magnetic reproducing head of a magnetic recording/reproducing device such as a hard disk drive include a sensor based on a magnetoresistance effect such as a giant magnetoresistance (GMR) effect or a tunnel magnetoresistance (TMR) effect. A magnetoresistive element used for these magnetic sensors is configured to include a ferromagnetic fixed layer having a fixed magnetization direction and a ferromagnetic free layer having a magnetization direction changing with external magnetic field, and a non-magnetic layer sandwiched therebetween, and operates based on a phenomenon where magnetic resistance of the element changes with the angle between the magnetization of the ferromagnetic fixed layer and the magnetization of the ferromagnetic free layer. In the case of magnetoresistive elements based on TMR, sense current flows in the film thickness direction. In the case of magnetoresistive elements based on GMR, they include a type of sense current flowing in the in-plane direction of the film and a type of sense current flowing in the film thickness direction.

Patent Document 1 describes a GMR element including a magnetic layer made of a half metallic material or a highly polarized material, thereby increasing the output of the GMR element, or a GMR element disposed on a 100% polarized spin injection layer and a barrier layer formed on a substrate, thereby increasing the output of the GMR element.

CITATION LIST

Patent Document

Patent Document 1: JP 2004-39941 A

SUMMARY OF INVENTION

Technical Problem

The GMR element in Patent Document 1 is configured so that electron spins in one direction only are allowed to flow in the element, whereby the output of the element is increased. For uniform spin directions of the current flowing through the GMR element, the element has to be made of a special magnetic material such as a half metallic material, a highly polarized material or a 100% polarized spin injection layer.

It is an object of the present invention to provide a magnetic detection device capable of increasing the output from a magnetoresistive element without using a special magnetic material, and capable of increasing the output from a magnetoresistive element including, as the magnetic film, a half metallic material or a highly polarized material as well.

Solution to Problem

When the magnetization of a ferromagnetic material has spatial non-uniformity or temporal non-uniformity, a spin electromotive force occurs there. The present invention is configured to generate and amplify spin current using such a spin electromotive force induced by spin waves in a magnetic material, thereby increasing a signal of a magnetic sensor including a magnetoresistive element and reducing noise thereof.

A magnetic detection device of the present invention includes: a magnetoresistive film including the lamination of a ferromagnetic reference layer having a fixed magnetization direction and a ferromagnetic free layer having a magnetization direction changing with external magnetic field, between which a non-magnetic layer is sandwiched; an electrode to flow current in a film thickness direction of the magnetoresistive film; another electrode to measure magnetic resistance of the magnetoresistive film; and a spin wave induction layer connected to the ferromagnetic reference layer. The spin wave induction layer injects, into the ferromagnetic reference layer, electrons having spins in a specific direction by a spin electromotive force internally generated.

Preferably, the spin wave induction layer has one end connected to the ferromagnetic reference layer and the other end connected to a ferromagnetic pinning layer having a fixed magnetization direction, and the magnetic detection device further includes an alternating magnetic field part to apply alternating magnetic field to the spin wave induction layer. This configuration allows standing waves of spin waves to be induced at the spin wave induction layer, whereby electrons having spins in a desired direction can be injected stably into the ferromagnetic reference layer of the magnetoresistive film.

A magnetic detection device including a plurality of magnetic sensors arranged in parallel, each having a spin wave induction layer, can reduce magnetic noise.

Two of the magnetic sensors of the prevent invention each including a magnetoresistive element including a spin wave induction layer to inject, into the ferromagnetic reference layer, electrons having spins in a specific direction by a spin electromotive force internally generated may be disposed so that magnetization directions of their ferromagnetic reference layers are in opposite directions. Then, the frequency of AC current as sense current is swept, and the frequency of the sense current when the difference in output between the two magnetic sensors becomes the peak is found, whereby the fluctuation frequency of external magnetic field can be detected.

Two of the magnetic sensors of the prevent invention each including a magnetoresistive element including a spin wave induction layer to inject, into the ferromagnetic reference layer, electrons having spins in a specific direction by a spin electromotive force internally generated may be disposed so that magnetization directions of their ferromagnetic reference layers are mutually orthogonal. Thereby, the direction of external magnetic field in a three-dimensional space can be found from outputs of the two magnetic sensors.

Advantageous Effects of Invention

The present invention can increase output of a magnetoresistive element.

Problems, configurations, and advantageous effects other than those described above will be made clear by the following description of embodiments.

DESCRIPTION OF EMBODIMENTS

The following describes embodiments of the present invention, with reference to the drawings.

Figure 1:
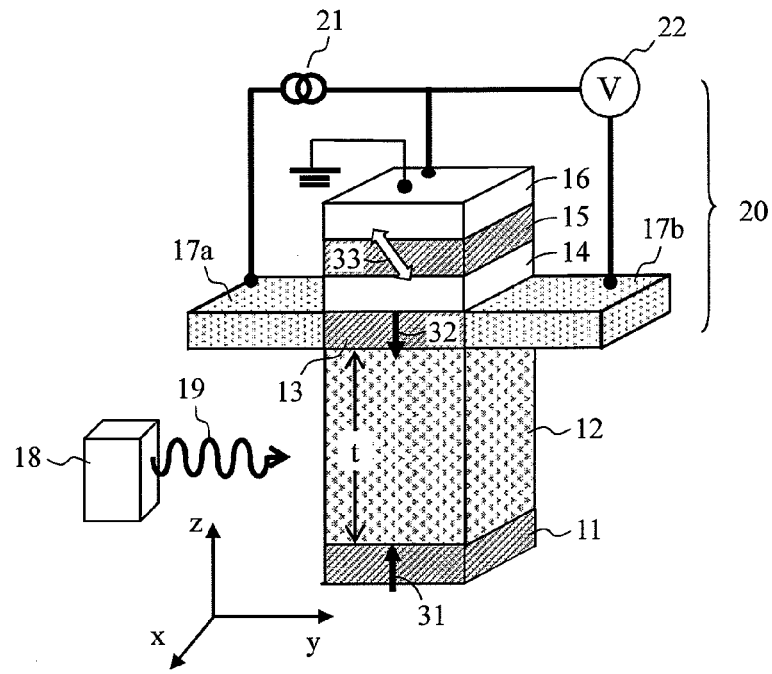
FIG. 1 schematically shows one embodiment of a magnetic detection device according to the present invention.

FIG. 1 schematically shows an exemplary magnetic detection device according to the present invention. The magnetic detection device shown in FIG. 1 includes the lamination of a ferromagnetic pinning layer 11, a spin wave induction layer 12, a ferromagnetic reference layer 13, a non-magnetic layer 14 and a ferromagnetic free layer 15. The ferromagnetic free layer 15 is connected to an electrode 16, and the ferromagnetic reference layer 13 is connected to electrodes 17a and 17b. The lamination structure including the non-magnetic layer 14 sandwiched between the ferromagnetic reference layer 13 and the ferromagnetic free layer 15 forms a magnetoresistive element, to which a power supply 21 and a voltmeter 22 are connected, thus configuring a magnetic detection unit 20. The power supply 21 is connected to the electrode 16 and the electrode 17a, so as to let sense current flow in the film thickness direction of the magnetoresistive element. The voltmeter 22 measures voltage of the magnetoresistive element. In the present embodiment, the power supply 21 is a constant current source, and magnetic resistance is found by measuring voltage across the magnetoresistive element. Alternatively, the power supply 21 may be a constant voltage source, and magnetic resistance may be found by measuring the magnitude of current flowing through the magnetoresistive element using an ammeter instead of the voltmeter 22.

The ferromagnetic pinning layer 11 and the ferromagnetic reference layer 13 on both sides of the spin wave induction layer 12 have opposite magnetization directions along a path via the spin wave induction layer 12, and their magnetization 31, 32 is fixed so as not to change with external magnetic field. On the other hand, the direction of magnetization 33 of the ferromagnetic free layer 15 changes with external magnetic field. An alternating magnetic field part 18 applies alternating magnetic field 19 to the spin wave induction layer 12. The electrodes 17a and 17b may be made of the same magnetic metal as that of the ferromagnetic reference layer 13, and the ferromagnetic free layer 15 may double as the electrode 16.

The ferromagnetic pinning layer 11 may be made of a material having high magnetic anisotropy, including iron (Fe), cobalt (Co), ferroplatinum (FePt), cobalt platinum (CoPt) or the like. This may be an antiferromagnetic-ferromagnetic exchange coupling film capable of giving large anisotropy field to the ferromagnetic material by pinning effect from the antiferromagnetic material, including manganese iridium (MnIr)/ferrocobalt (CoFe), MnIr/ferrosilicon (FeSi), ferromanganese (FeMn)/ferronickel (NiFe) or the like. The ferromagnetic pinning layer 11 may have a film thickness of 10 nm to 100 nm. The spin wave induction layer 12 is preferably made of a material having low magnetic anisotropy for easy driving of the magnetization, including permalloy (Py:NiFe alloy), Fe, cobalt-iron-boron (CoFeB) or the like. The spin wave induction layer 12 is just to confine standing waves stably, and so this configuration has an advantage of transmitting information in the direction of spins along the distance of 10 times or more than a typical spin-current device, which is dominated by the spin-scattering length. To this end, the spin wave induction layer 12 has to have a film thickness t of about 50 times the spin-scattering length, preferably 500 times or less. For instance, the spin wave induction layer 12 made of Py preferably has a film thickness of about 100 nm. The ferromagnetic reference layer 13 may be made of Fe, Co, FePt or the like. The ferromagnetic reference layer 13 may have a film thickness of 5 nm to 50 nm. The non-magnetic layer 14 may be made of Cu, Al, Ag, MgO, AlOx or the like. The non-magnetic layer 14 may have a film thickness of 1 nm to 2 nm. When the non-magnetic layer 14 is made of a conductive material, the magnetic detection unit configured is a GMR element, and when the non-magnetic layer is made of an electric insulation material, the magnetic detection unit configured is a TMR element. The ferromagnetic free layer 15 may be made of Py, Fe, CoFeB or the like, having a film thickness of 10 nm to 20 nm. The alternating magnetic field part 18 may be configured to apply the alternating magnetic field 19 at the frequency of about 100 MHz to the spin wave induction layer 12. For instance, the alternating magnetic field part 18 may be an air-cored coil, through which AC current flows. The alternating magnetic field part 18 is preferably disposed integrally and in the vicinity of the spin wave induction layer 12 so as not to affect the magnetic detection unit 20.

Figure 2:
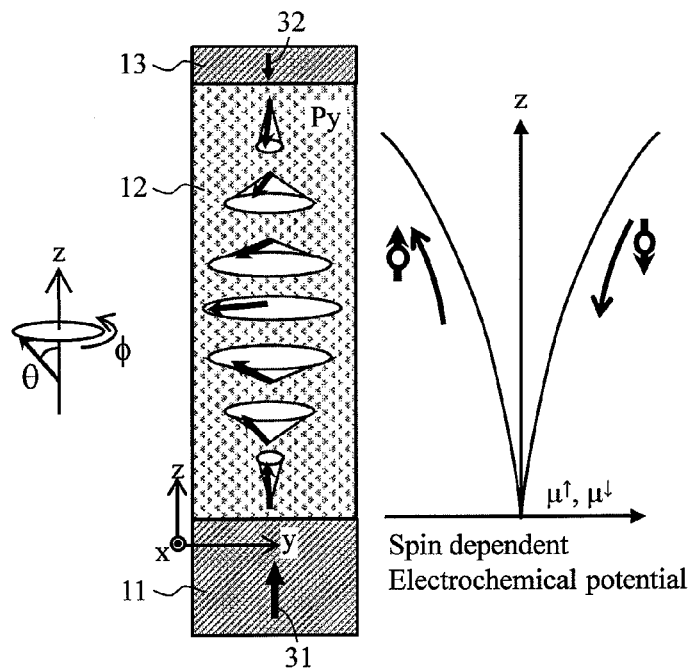
FIG. 2 schematically shows the principle to generate a spin electromotive force at a spin wave induction layer.

Referring to FIG. 2, the following describes the function of the spin wave induction layer 12. When the alternating magnetic field 19 is applied from the alternating magnetic field part 18 to the spin wave induction layer 12, the magnetization inside the spin wave induction layer 12 generates a precession movement. This excites spin waves so that the precession movement of the magnetization propagates spatially in the form of waves due to interactions between adjacent magnetization states. FIG. 2 schematically shows the spin waves propagating in the spin wave induction layer 12 with arrows, each arrow indicating magnetization at a position in the spin wave induction layer 12. Herein, since the spin wave induction layer 12 have both ends in contact with the ferromagnetic pinning layer 11 and the ferromagnetic reference layer 13, directions of the magnetization at the both ends become the same directions of the magnetization 31 of the ferromagnetic pinning layer 11 and of the magnetization 32 of the ferromagnetic reference layer 13. As a result, spin waves induced in the spin wave induction layer 12 are standing waves having fixed ends at the both ends. As shown in FIG. 2, they typically are standing waves where the central part becomes the anti-node and the both ends become the nodes. In this way, the magnetization in the spin wave induction layer 12 changes spatially as well as temporally.

When such spatial non-uniformity and temporal non-uniformity coexist in the magnetization of a magnetic material, a spin electromotive force $F_z$ typically generates there. Considering a polar coordinate system having a z-axis direction in the direction connecting the ferromagnetic pinning layer 11 and the ferromagnetic reference layer 13, the angle θ that is the angle with reference to the z-axis and the rotation angle φ around the z-axis, the spin electromotive force Fz can be represented by the following Expression (1).

$$F_z = eE_z = \pm \frac{\hbar}{2}\sin\theta\left(\frac{\partial\theta}{\partial t}\frac{\partial\phi}{\partial z} - \frac{\partial\phi}{\partial t}\frac{\partial\theta}{\partial z}\right) \quad (1)$$

Since the spin waves induced at the spin wave induction layer are standing waves, the following Expression (2) holds, and Expression (1) can be Expression (3).

$$\frac{\partial\theta}{\partial t} = 0, \frac{\partial\theta}{\partial z} \neq 0, \frac{\partial\phi}{\partial t} \neq 0, \frac{\partial\phi}{\partial z} \neq 0 \quad (2)$$

$$eE_z = \pm\frac{\hbar}{2}\sin\theta\left(-\omega\frac{\partial\theta}{\partial z}\right) \quad (3)$$

$$\omega = \frac{\partial\phi}{\partial t}$$

The sign ± on the right side of (3) indicates that the directions of the electromotive force are opposite between upward spins and downward spins, i.e., electrical field in opposite directions can be applied independently to electrons with the upward spins and electrons with the downward spins. This means that the electrons with the upward spins and the electrons with the downward spins move in the opposite directions, so that electrons with spins in one of the directions can be selectively injected into the ferromagnetic reference layer 13 of the magnetoresistive element. In the Expression, ω denotes the period of the precession movement of the magnetization that is excited by the alternating magnetic field. In this way, the spin electromotive force becomes proportional to the frequency of the alternating magnetic field, and so the magnitude of the spin electromotive force can be controlled by changing the frequency of the alternating magnetic field. For instance, when alternating magnetic field at the frequency of 100 MHz is applied to the spin wave induction layer made of Py and having a film thickness of 100 nm, then the spin electromotive force obtained is 130 neV. As shown in FIG. 2 on the right side, electrochemical potential obtained is the total energy given as the number density of the upward spins and the downward spins.

The magnetic detection unit 20 is provided with the constant current source 21 that lets current flowing in the direction from the side of the ferromagnetic free layer 15 to the ferromagnetic reference layer 13 of the magnetoresistive element, for example. In this case, more electrons having spins in the same direction of the magnetization 32 of the ferromagnetic reference layer 13 flow into the ferromagnetic free layer 15 from the ferromagnetic reference layer 13 via the non-magnetic layer 14, which then interact with the magnetization 33 of the ferromagnetic free layer 15, thus generating a magnetoresistance effect. Resistance changing rate due to the magnetoresistance effect depends on the polarization of the spins (spin polarizing coefficient) injected into the magnetic detection unit 20 through the ferromagnetic reference layer 13. The present invention is configured so as to inject spins in a specific direction from the spin wave induction layer 12 to the ferromagnetic reference layer 13, thereby increasing effective spin polarizing coefficient of the ferromagnetic reference layer 13 and so increasing the resistance changing rate of the magnetic resistive element. This increases an output signal of the magnetic detection unit 20.

Figure 3:
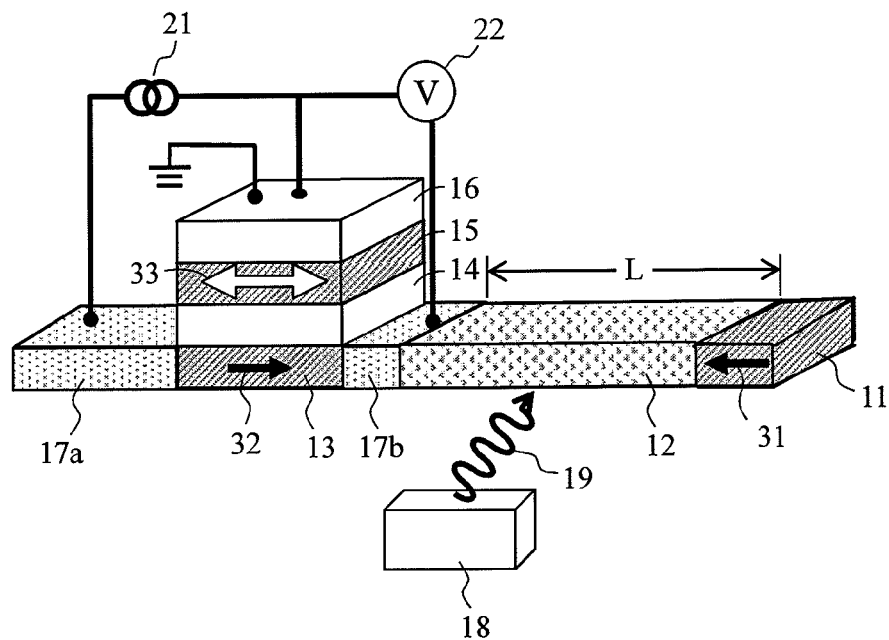
FIG. 3 schematically shows another embodiment of the magnetic detection device of the present invention.

FIG. 3 schematically shows another embodiment of the magnetic detection device of the present invention.

The embodiment shown in FIG. 1 includes the spin wave induction layer in contact with the lower face of the ferromagnetic reference layer of the magnetoresistive element. The magnetic detection unit of the present embodiment is configured so that a spin wave induction layer 12 is connected to a side face of a ferromagnetic reference layer 13 of the magnetoresistive element.

The spin wave induction layer 12 in the present embodiment has one end in contact with a ferromagnetic pinning layer 11 and the other end in contact with the ferromagnetic reference layer 13 via the electrode 17b. In this case, the electrode 17b preferably is made of the same conductive magnetic material as that of the ferromagnetic reference layer 13. Magnetization 31 of the ferromagnetic pinning layer 11 and magnetization 32 of the ferromagnetic reference layer 13 are in opposite directions, which are fixed so as not to be affected by external magnetic field. The spin wave induction layer 12 is just to confine standing waves stably, and so this configuration has an advantage of transmitting information in the direction of spins along the distance of 10 times or more than a typical spin-current device, which is dominated by the spin-scattering length. To this end, the length L of the spin wave induction layer 12 is about 500 times or less of the spin-scattering length.

The present embodiment is configured not as a perpendicular magnetization film where magnetization of the GMR and the MTJ is perpendicular to the film face but as an in-plane direction magnetization film, which are relatively easily to form. Further, since the magnetic detection unit and the spin wave induction layer can be separated spatially, the configuration has an advantage that the magnetization of the free layer of the magnetic detection unit is less influenced by the alternating magnetic field than in the configuration of FIG. 1.

Figure 4:
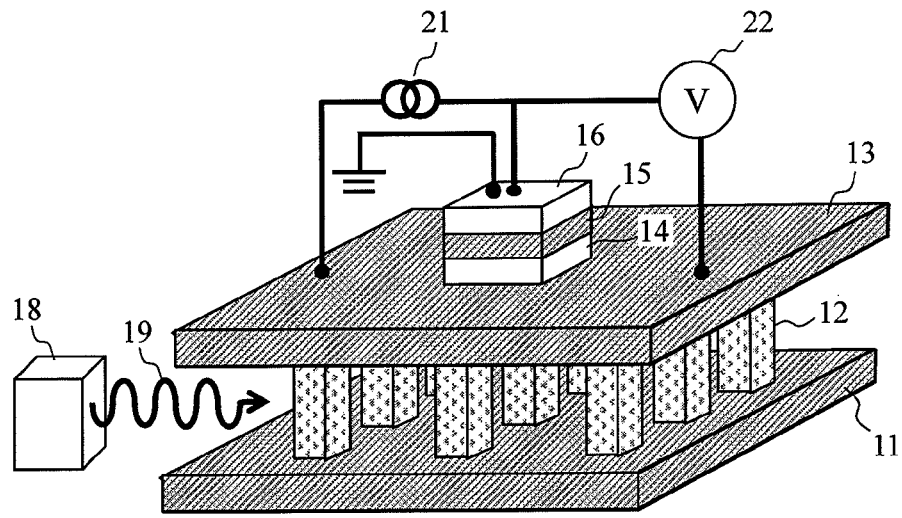
FIG. 4 schematically shows still another embodiment of the magnetic detection device of the present invention.
Figure 5:
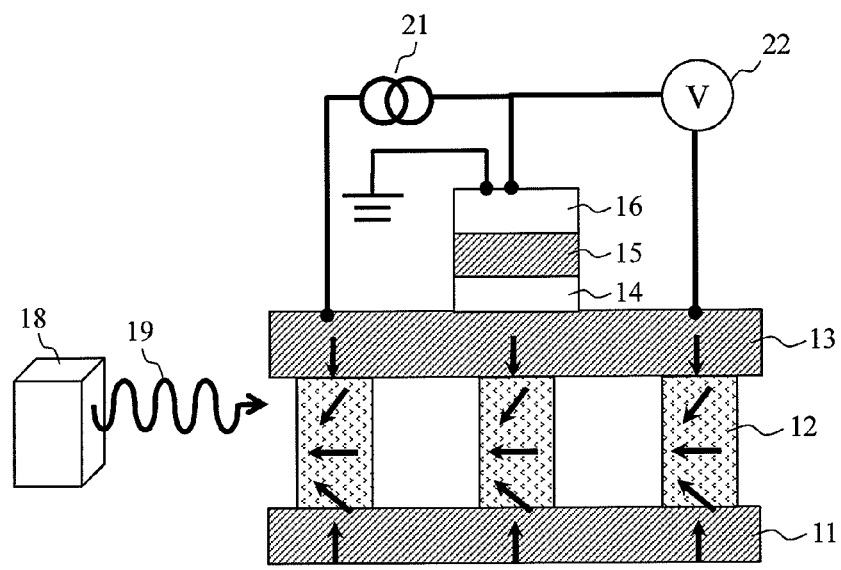
FIG. 5 is a schematic cross-sectional view of one embodiment of the magnetic detection device according to the present invention.

FIG. 4 schematically shows another embodiment of the magnetic detection device of the present invention, and FIG. 5 is a schematic cross-sectional view thereof.

The present embodiment is configured to inject spin-current from a plurality of spin wave induction layers, so as to increase the amount of spin-current injected into the ferromagnetic reference layer of the magnetoresistive element. The plurality of spin wave induction layers 12 are connected in parallel between the ferromagnetic reference layer 13 and the ferromagnetic pinning layer 11 of one magnetoresistive element, and alternating magnetic field 19 is applied from the alternating magnetic field part 18 to each spin wave induction layer. Spin-current generated from each spin wave induction layer, e.g., electrons with downward spins are joined into the ferromagnetic reference layer 13 for injection. In this way, the amount of spin-current injected into the ferromagnetic reference layer is increased more than the configuration including one spin wave induction layer, and so the effective spin polarization rate of the ferromagnetic reference layer can be increased and the output signal of the magnetoresistive element can be more increased.

The illustrated example includes the ferromagnetic pinning layer 11 as one common layer to all of the spin wave induction layers 12. As shown in FIG. 1, a ferromagnetic pinning layer may be provided for each of the spin wave induction layer. Since the ferromagnetic reference layer 13 is required to have a single magnetic domain structure stably, it desirably has a size of the order of 100 nm. For instance, in the case of CoFe, it may have the size of about 400 nm×400 nm×5 nm.

Figure 6:
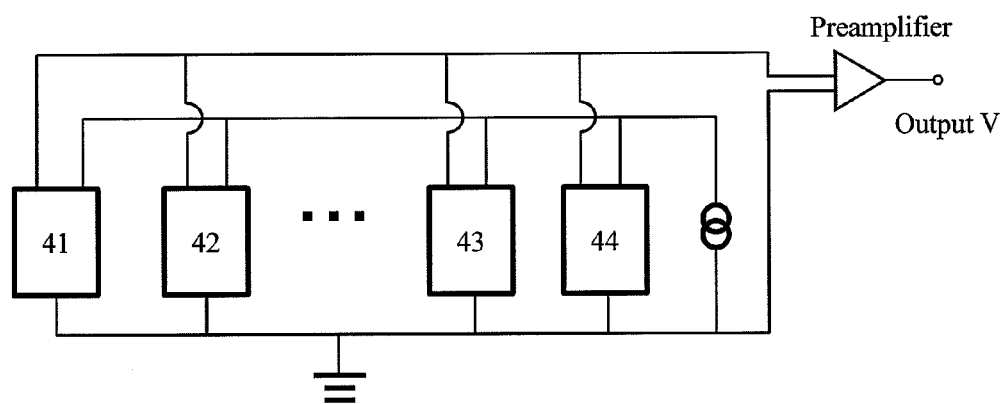
FIG. 6 schematically shows a further embodiment of the magnetic detection device of the present invention.

FIG. 6 schematically shows still another embodiment of the magnetic detection device of the present invention.

The magnetic detection device of the present embodiment includes a plurality of magnetic sensors connected in parallel, each including a spin wave induction layer. Each of rectangular blocks 41 to 44 shown in the drawing is a magnetic sensor as described in FIG. 1, FIG. 3 or FIG. 4. A plurality of magnetic sensors arranged in parallel as in the present embodiment can reduce magnetic noise.

Figure 7:
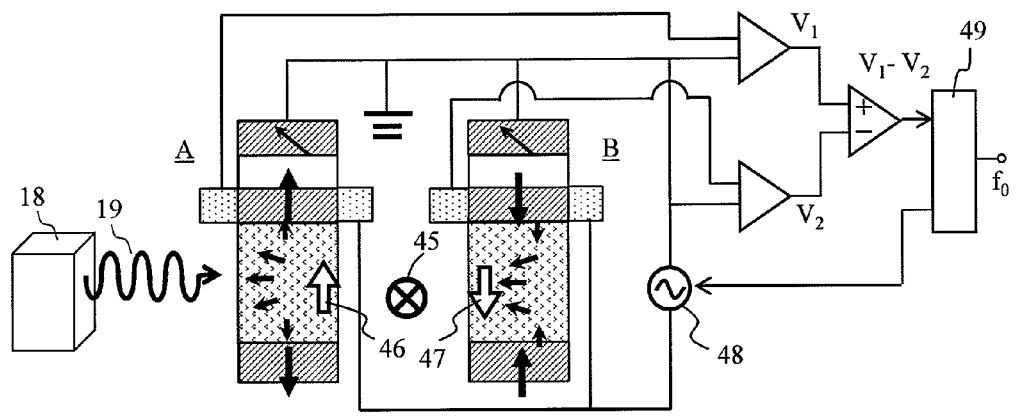
FIG. 7 schematically shows a still further embodiment of the magnetic detection device of the present invention.
Figure 8:
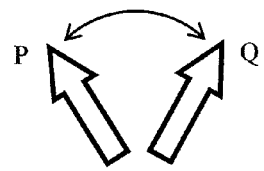
FIG. 8 schematically shows the state of magnetization of a ferromagnetic free layer of a magnetic detection unit that oscillates with the oscillation of external magnetic field.

FIG. 7 schematically shows a further embodiment of the magnetic detection device of the present invention. The magnetic detection device of the present embodiment is configured to detect the oscillation frequency when external magnetic field oscillates temporally at the frequency $f_0$. As shown in FIG. 8, magnetization of the ferromagnetic free layer of the magnetic detection unit also oscillates between two states of P and Q at the frequency $f_0$ in accordance with the oscillation of the external magnetic field.

As shown in FIG. 7, the present embodiment includes a pair of a magnetoresistive element A and a magnetoresistive element B having the opposite magnetization directions of their ferromagnetic free layers, and is configured to measure a difference ($V_1-V_2$) in output $V_1$, $V_2$ between the two magnetoresistive elements. Similarly to the above embodiments, the magnetization direction of each of the ferromagnetic pinning layers connected via the spin wave induction layers in the magnetoresistive elements A and B is opposite to the magnetization direction of the corresponding ferromagnetic reference layer. The drawing does not show an electrode connected above the ferromagnetic free layer. Magnetic field 46 and 47 in opposite directions is applied to the two spin wave induction layers so as to generate spin electromotive forces in opposite directions at the spin wave induction layers connected to the two magnetoresistive elements A and B. The application of the magnetic field 46 and 47 in opposite directions makes the directions of effective magnetic field, which are the axes of the spin precession at the two spin wave induction layers, opposite to each other, which means that the precession of spins rotate in opposite directions. The magnetic field 46 and 47 is generated by flowing current 45 through conductive wire disposed between the two spin wave induction layers. In the illustrated example, the current 45 flows from the surface to the rear face of the sheet. A power supply 48 used is a frequency-variable AC power supply so as to let AC current pass through the magnetoresistive elements A and B as sense current. The power supply frequency is swept by a control operation unit 49.

Figure 9:
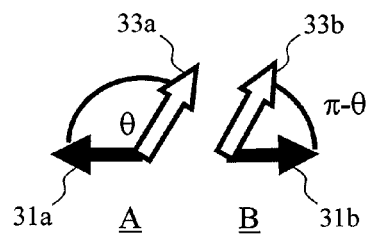
FIG. 9 illustrates the relation between magnetization of a ferromagnetic reference layer and magnetization of a ferromagnetic free layer in two magnetic sensors.

FIG. 9 illustrates the relation between magnetization 31a of the ferromagnetic reference layer and magnetization 33a of the ferromagnetic free layer in the magnetoresistive element A and magnetization 31b of the ferromagnetic reference layer and magnetization 33b of the ferromagnetic free layer in the magnetoresistive element B. Both of the magnetization states 33a and 33b of the ferromagnetic free layers of the two magnetoresistive elements A and B are in the direction of the external magnetization. On the other hand, the magnetization states 31a and 31b of the ferromagnetic reference layers of the two magnetoresistive elements A and B are in the mutually opposite directions. Then, letting that the angle between the magnetization 31a of the ferromagnetic reference layer and the magnetization 33a of the ferromagnetic free layer of the magnetoresistive element A is θ, the angle between the magnetization 31b of the ferromagnetic reference layer and the magnetization 33b of the ferromagnetic free layer of the magnetoresistive element B is (π−θ).

Figure 10:
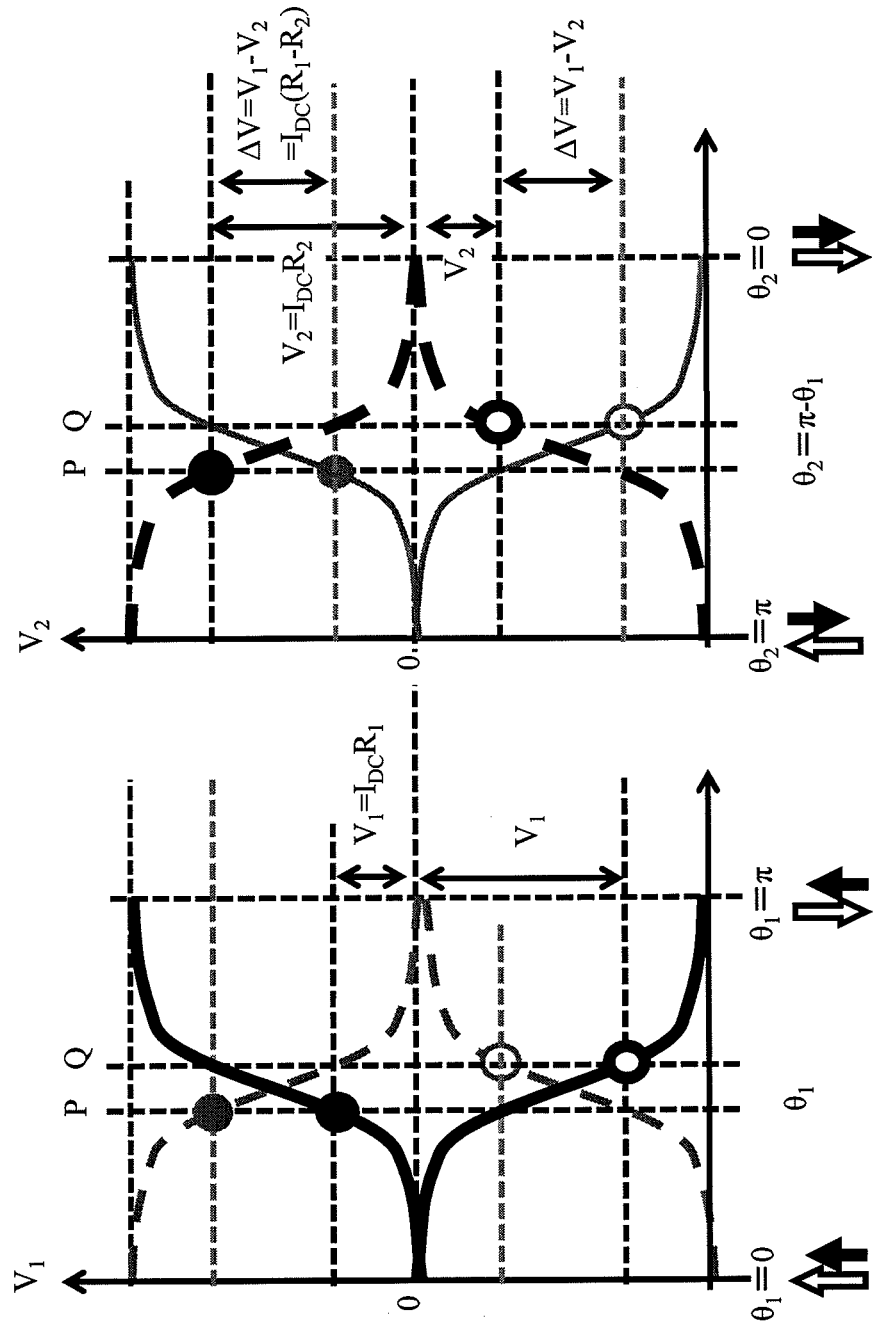
FIG. 10 shows the relation between the outputs of two magnetic sensors.

FIG. 10 shows the relation between the outputs $V_1$ and $V_2$ of two magnetic detection units including the magnetoresistive elements A and B.

A magnetoresistive element has magnetic resistance R that changes as in FIG. 16 described later between parallel and anti-parallel depending on the angle θ between the magnetization of the ferromagnetic reference layer and the magnetization of the ferromagnetic free layer. As a result, the output voltage, which follows V=IR, is determined by the magnetic resistance R depending on θ and the direction of the sense current I. That is, the sign of the output voltage is reversed with the direction of the sense current. When electrons are injected from the ferromagnetic reference layer, the output $V_1$ on the magnetoresistive element A side changes as in the solid line indicated with black circles in the upper left of FIG. 10, depending on the angle $θ_1$ between the magnetization of the ferromagnetic free layer and the magnetization of the ferromagnetic reference layer. When the direction of the sense current is reversed so that electrons are injected into the ferromagnetic reference layer, the output changes as in the solid line indicated with white circles in the lower left of FIG. 10, thus changing the sign of the output. Since the output $V_2$ on the magnetoresistive element B side has the relation of $θ_2=π−θ_1$, the output changes as shown on the right side of FIG. 10.

Figure 11:
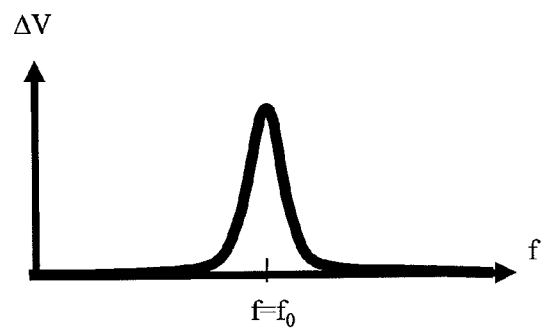
FIG. 11 shows the relation between the frequency and the output ΔV of sense current.

When the magnetization of the ferromagnetic free layer oscillates at the frequency of $f_0$, oscillation of the sense current in synchronization therewith yields the difference in output ($V_1-V_2$) that is ΔV as shown in the drawing. However, when the frequency of the sense current is not in synchronization with the frequency of the external magnetic field, phase shift occurs, and the output does not appear because it is mostly erased by temporal integration. As a result, as shown in FIG. 11, the frequency corresponding to the peak appearing in differential output due to AC frequency sweeping of the sense current becomes the frequency of the magnetic field to be detected. The control operation unit 49 outputs the power supply frequency where the output ΔV becomes the peak as the oscillation frequency $f_0$ of the magnetic field to be detected.

The sense current picks up whether the external magnetic field to be detected is in synchronization with the frequency of the sense current or not. For instance, instead of frequency analysis of the output from one sensor, two sensors are used as in the present embodiment, whereby synchronizing frequency thereof is detected using AC sense current, whereby 1/f noise, which becomes a problem for a low frequency of 1 MHz or less, can be reduced.

Figure 12:
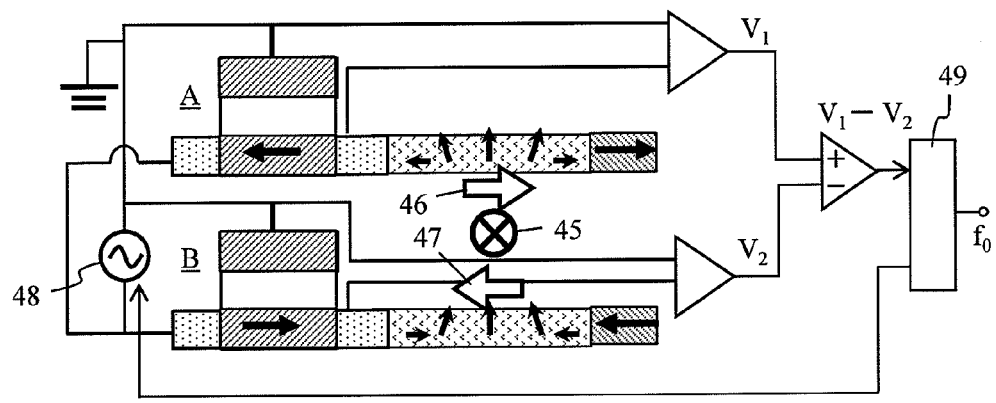
FIG. 12 schematically shows a modification example of the embodiment in FIG. 7.
Figure 13:
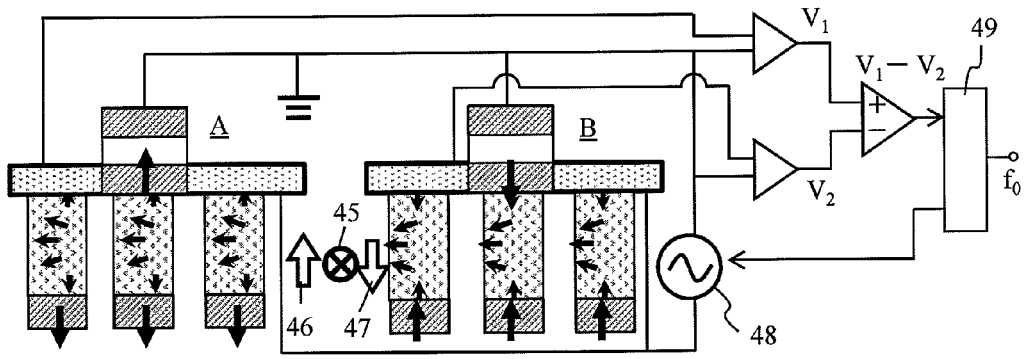
FIG. 13 schematically shows another modification example of the embodiment in FIG. 7.

FIGS. 12 and 13 schematically show modification examples of FIG. 7 showing the principle of these examples. FIG. 12 is an embodiment that is different from FIG. 7 in a spin wave induction layer connected to the magnetoresistive element that is disposed at a side of a ferromagnetic reference layer like FIG. 3. FIG. 13 is an embodiment that is different from FIG. 7 in a plurality of spin wave induction layers connected to the magnetoresistive element that are disposed in parallel like FIG. 5. Both of them are different from FIG. 7 just in the disposition of the spin wave induction layer(s) relative to the magnetic detection unit, and other configuration is the same as in FIG. 7. FIGS. 12 and 13 omit the illustration of an electrode connected to the ferromagnetic free layer of the magnetoresistive element.

Figure 14:
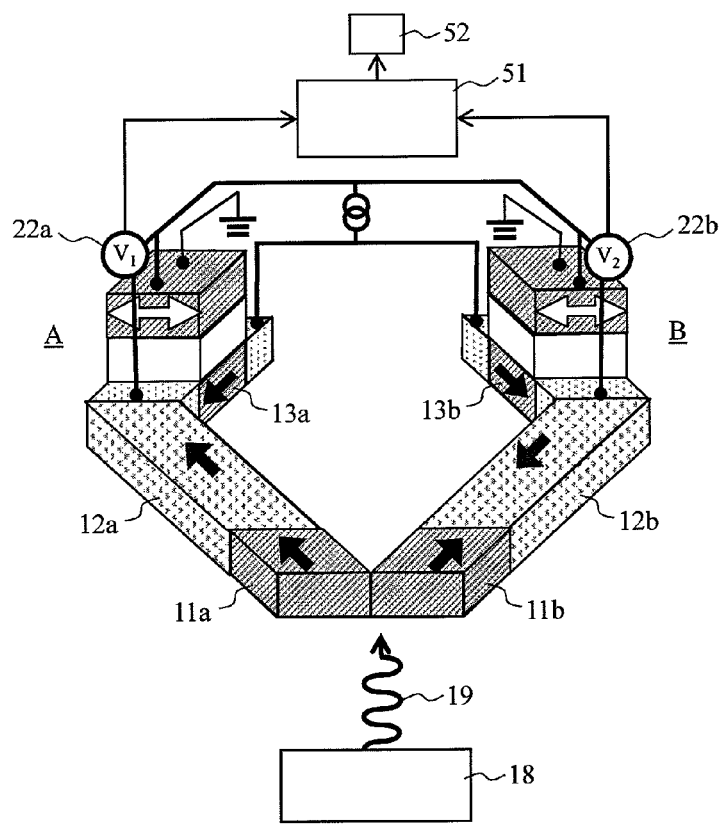
FIG. 14 schematically shows another embodiment of the magnetic detection device of the present invention.

FIG. 14 schematically shows a still further embodiment of the magnetic detection device of the present invention. The present embodiment is configured to include the combination of two magnetoresistive elements having mutually orthogonal magnetization directions of their ferromagnetic reference layers, thus enabling detection of magnetic field in any direction. This drawing omits the illustration of an electrode connected to the ferromagnetic free layer of the magnetoresistive element.

A first magnetoresistive element A and a second magnetoresistive element B are disposed so that the magnetization directions of their ferromagnetic reference layers 13a and 13b are mutually orthogonal. Then the magnetization of a ferromagnetic pinning layer 11a connected to the ferromagnetic reference layer 13a via the spin wave induction layer 12a of the magnetoresistive element A and the magnetization of a ferromagnetic pinning layer 11b connected to the ferromagnetic reference layer 13b via the spin wave induction layer 12b of the magnetoresistive element B are mutually orthogonal as well. FIG. 14 shows the example of the magnetoresistive elements where the spin wave induction layers 12a and 12b are disposed at a side of the ferromagnetic reference layers 13a and 13b, respectively, and the spin wave induction layers may be disposed below the ferromagnetic reference layers in the stacking direction of the magnetoresistive elements as in FIG. 1. The output $V_1$ of a voltmeter 22a of the magnetic detection unit including the first magnetoresistive element A and the output $V_2$ of a voltmeter 22b of the magnetic detection unit including the second magnetoresistive element B are input to an operation unit 51. The operation unit calculates the direction of external magnetic field based on the output characteristics of the magnetoresistive elements that are stored as $V_1$ and $V_2$ and outputs the resultant at a display 52.

Figure 15:
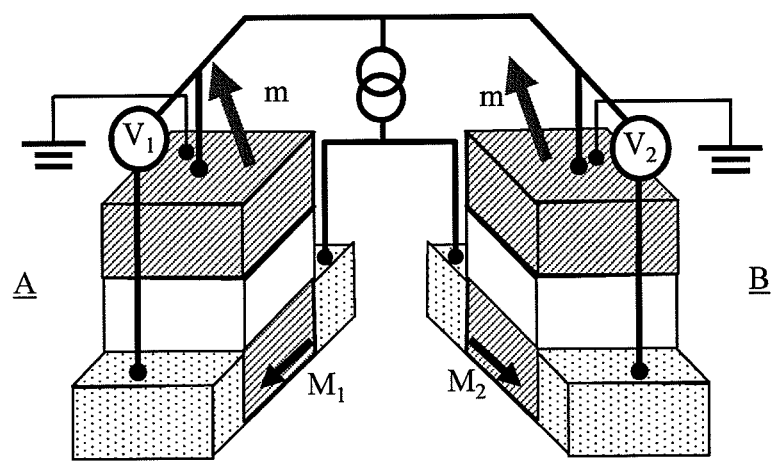
FIG. 15 schematically shows magnetic detection units only in the magnetic detection device.

FIG. 15 schematically shows the magnetic detection units only in the magnetic detection device shown in FIG. 14. For the sake of simplicity, let that the first magnetoresistive element A and the second magnetoresistive element B have the same structure and magnetic characteristics, and they are disposed so that magnetization $M_1$, $M_2$ of their ferromagnetic reference layers forms the angle of 90°. Both of the ferromagnetic reference layers of the two magnetoresistive elements A and B have magnetization m in the direction of the external magnetic field. Let that, in this state, the angle between the magnetization $M_1$ and the magnetization m is $\theta_1$ and the angle between the magnetization $M_2$ and the magnetization m is $\theta_2$.

Figure 16:
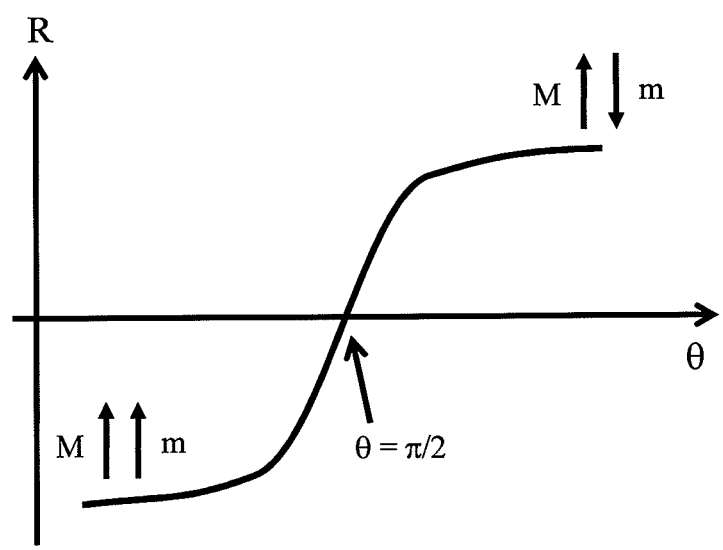
FIG. 16 shows the relation between the angle θ between magnetization of a ferromagnetic reference layer and magnetization of a ferromagnetic free layer and the magnetic resistance R.

FIG. 16 shows the relation between the angle θ between the magnetization M of the ferromagnetic reference layer and the magnetization m of the ferromagnetic free layer and the magnetic resistance R in a magnetic resistive element. When the magnetization M and the magnetization m are parallel, the magnetic resistance R becomes the minimum, and when the magnetization M and the magnetization m are anti-parallel, the magnetic resistance R becomes the maximum. When the power supply used is a constant current source, the magnetic resistance R is in proportion to the measurement voltage $V_1$ and $V_2$ by the voltmeters, and so FIG. 16 shows the relation between the measurement voltage $V_1$ and $V_2$ and the angles $\theta_1$ and $\theta_2$ as well. That is, the angle $\theta_1$ can be found from the measurement voltage $V_1$ of the voltmeter of the first magnetic detection unit. Similarly, the angle $\theta_2$ can be found from the measurement voltage $V_2$ of the voltmeter of the second magnetic detection unit. When the power supply used is a constant voltage source, the magnetic resistance is in inverse proportion to the current. Then, current flowing through the elements is measured by an ammeter instead of the voltmeter, whereby the angles $\theta_1$ and $\theta_2$ can be found based on the relation of FIG. 16.

Figure 17:
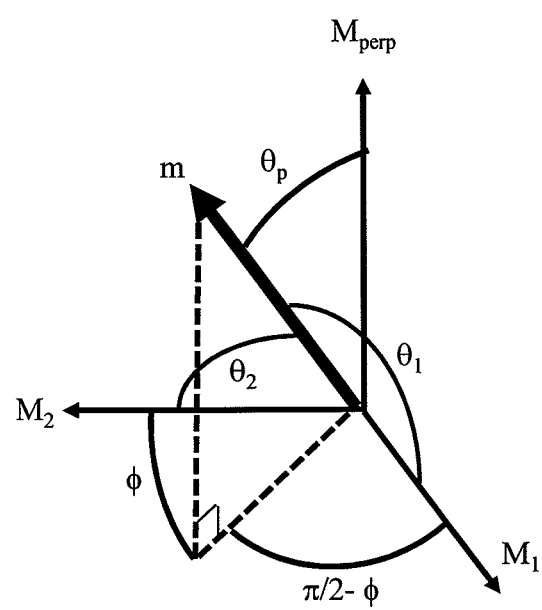
FIG. 17 shows the relations among three vectors of $M_1$, $M_2$ and m.

As shown in FIG. 17, letting that the direction perpendicular to the magnetization $M_1$ and the magnetization $M_2$ is $M_{perp}$, and considering a three-dimensional rectangular coordinate system having the coordinate axes of $M_1$, $M_2$ and $M_{perp}$, three vectors of $M_1$, $M_2$ and m have the relation as shown in the drawing. Letting that the angle between the magnetization m and $M_{perp}$ is $\theta_p$ and the angle between the projection of the magnetization m to the $M_1M_2$ plane and $M_2$ is $\phi$, if the angle ($\theta_p$, $\phi$) can be found, the direction of the magnetization m, i.e., the direction of the external magnetic field can be found. Herein, the following expression holds between $\theta_1$, $\theta_2$ and $\theta_p$, $\phi$ due to their geometric relations.

$$\cos \theta_1 = \sin \theta_p \cdot \cos \phi \quad (4)$$

$$\cos \theta_2 = \sin \theta_p \cdot \sin \phi \quad (5)$$

As stated above, the angle $\theta_1$ between the magnetization $M_1$ and the magnetization m and the angle $\theta_2$ between the magnetization $M_2$ and the magnetization m can be found from the output $V_1$ and $V_2$ of the two magnetic detection units, based on which the direction of the magnetization m, i.e., the direction ($\theta_p$, $\phi$) of the external magnetic field in the three dimensional space can be found based on the above Expressions (4) and (5). The operation unit 51 stores the relation between the angle θ between magnetization states of two ferromagnetic layers of the magnetoresistive elements being used and the magnetic resistance R, and finds $\theta_1$ and $\theta_2$ based on the relation. The operation unit 51 further calculates the direction ($\theta_p$, $\phi$) of the external magnetic field based on the relations of the above Expressions (4) and (5) and displays the resultant at the display 52.

That is the embodiments of the magnetic detection devices of the present invention capable of increasing the output signal of a magnetoresistive element. The magnetic detection devices of the present invention can be used for a reproducing sensor of a magnetic head, a magnetic sensor of a bioinstrumentation apparatus to perform magnetic detection such as detection of brain waves, a magnetic sensor of a motor and the like.

The present invention is not limited to the above-described examples, and may include various modification examples. For instance, the entire detailed configuration of the embodiments described above for explanatory convenience is not always necessary for the present invention. A part of one embodiment may be replaced with the configuration of another embodiment, or the configuration of one embodiment may be combined with the configuration of another embodiment. The configuration of each embodiment may additionally include another configuration, or a part of the configuration may be deleted or replaced.

REFERENCE SIGNS LIST

11 Ferromagnetic pinning layer
12 Spin wave induction layer
13 Ferromagnetic reference layer
14 Non-magnetic layer
15 Ferromagnetic free layer 18 Alternating magnetic field part
19 Alternating magnetic field
20 Magnetic detection unit
21 Power supply
22 Voltmeter
49 Control operation unit
51 Operation unit
52 Display

The invention claimed is:

1. A magnetic detection device, comprising:
    a magnetoresistive film including a lamination of a ferromagnetic reference layer having a fixed magnetization direction and a ferromagnetic free layer having a magnetization direction changing with external magnetic field, between which a non-magnetic layer is sandwiched;
    an electrode to flow current in a film thickness direction of the magnetoresistive film;
    another electrode to measure magnetic resistance of the magnetoresistive film;
    a spin wave induction layer connected to the ferromagnetic reference layer; and
    an alternating magnetic field part to apply alternating magnetic field to the spin wave induction layer,
        wherein the spin wave induction layer injects, into the ferromagnetic reference layer, electrons having spins in a specific direction by a spin electromotive force internally generated,
        wherein the spin wave induction layer has one end connected to the ferromagnetic reference layer and another end connected to a ferromagnetic pinning layer having a fixed magnetization direction, and
        wherein the ferromagnetic pinning layer and the ferromagnetic reference layer have opposite magnetization directions.

2. The magnetic detection device according to claim 1, wherein the spin wave induction layer is connected to a face of the ferromagnetic reference layer that is on an opposite side of the non-magnetic layer.

3. The magnetic detection device according to claim 1, wherein the spin wave induction layer is connected to a side face of the ferromagnetic reference layer.

4. The magnetic detection device according to claim 1, wherein a plurality of spin wave induction layers are connected in parallel to the ferromagnetic reference layer.

5. A magnetic detection device, comprising:
    a first magnetic sensor including:
        a first magnetoresistive element including a first lamination of a first ferromagnetic reference layer having a fixed magnetization direction and a ferromagnetic free layer having a magnetization direction changing with external magnetic field, between which a non-magnetic layer is sandwiched, and
        a first spin wave induction layer that is connected to the first ferromagnetic reference layer and injects, into the first ferromagnetic reference layer, first electrons having spins in a specific direction by a spin electromotive force internally generated;
    a second magnetic sensor including:
        a second magnetoresistive element including a second lamination of a second ferromagnetic reference layer having a fixed magnetization direction and a ferromagnetic free layer having a magnetization direction changing with external magnetic field, between which a non-magnetic layer is sandwiched, and
        a second spin wave induction layer that is connected to the second ferromagnetic reference layer and injects, into the second ferromagnetic reference layer, second electrons having spins in a specific direction by a spin electromotive force internally generated;
    a power supply to flow current in a film thickness direction of the first magnetoresistive element and the second magnetoresistive element;
    a first measurement unit that measures magnetic resistance of the first magnetoresistive element;
    a second measurement unit that measures magnetic resistance of the second magnetoresistive element; and
    an operation unit that stores characteristics of the first magnetoresistive element and the second magnetoresistive element, and calculates a direction of external magnetic field based on an output of the first measurement unit and the second measurement unit,
        wherein the first ferromagnetic reference layer and the second ferromagnetic reference layer have magnetization directions that are mutually orthogonal.

6. The magnetic detection device according to claim 5, wherein
    the first spin wave induction layer has one end connected to the first ferromagnetic reference layer and another end connected to a first ferromagnetic pinning layer having a fixed magnetization direction,
    the first ferromagnetic pinning layer and the first ferromagnetic reference layer have opposite magnetization directions,
    the second spin wave induction layer has one end connected to the second ferromagnetic reference layer and another end connected to a second ferromagnetic pinning layer having a fixed magnetization direction,
    the second ferromagnetic pinning layer and the second ferromagnetic reference layer have opposite magnetization directions, and
    the magnetic detection device further comprises an alternating magnetic field part to apply alternating magnetic field to the first spin wave induction layer and the second spin wave induction layer.

7. A magnetic detection device, comprising:
    a first magnetic sensor including:
        a first magnetoresistive element including a first lamination of a first ferromagnetic reference layer having a fixed magnetization direction and a ferromagnetic free layer having a magnetization direction changing with external magnetic field, between which a non-magnetic layer is sandwiched, and
        a first spin wave induction layer that is connected to the first ferromagnetic reference layer and injects, into the first ferromagnetic reference layer, first electrons having spins in a specific direction by a spin electromotive force internally generated;
    a second magnetic sensor including:
        a second magnetoresistive element including a second lamination of a second ferromagnetic reference layer having a fixed magnetization direction and a ferromagnetic free layer having a magnetization direction changing with external magnetic field, between which a non-magnetic layer is sandwiched, and
        a second spin wave induction layer that is connected to the second ferromagnetic reference layer and injects, into the second ferromagnetic reference layer, second electrons having spins in a specific direction by a spin electromotive force internally generated;
    an AC power supply to flow AC current in a film thickness direction of the first magnetoresistive element and the second magnetoresistive element;

a differential detector to detect a difference between an output of the first magnetoresistive element and an output of the second magnetoresistive element; and an operation control unit to sweep frequency of the AC power supply and output frequency when a detected signal by the differential detector becomes a peak as a fluctuation frequency of external magnetic field, wherein the first ferromagnetic reference layer and the second ferromagnetic reference layer have opposite magnetization directions.

8. The magnetic detection device according to claim 7, wherein the first spin wave induction layer has one end connected to the first ferromagnetic reference layer and another end connected to a first ferromagnetic pinning layer having a fixed magnetization direction, the first ferromagnetic pinning layer and the first ferromagnetic reference layer have opposite magnetization directions, the second spin wave induction layer has one end connected to the second ferromagnetic reference layer and another end connected to a second ferromagnetic pinning layer having a fixed magnetization direction, the second ferromagnetic pinning layer and the second ferromagnetic reference layer have opposite magnetization directions, and the magnetic detection device further comprises an alternating magnetic field part to apply alternating magnetic field to the first spin wave induction layer and the second spin wave induction layer.

* * * * *